(12) United States Patent
Liu et al.

(10) Patent No.: US 11,362,014 B2
(45) Date of Patent: Jun. 14, 2022

(54) POWER MODULE

(71) Applicant: INDUSTRIAL TECHNOLOGY RESEARCH INSTITUTE, Hsinchu (TW)

(72) Inventors: Chun-Kai Liu, Hsinchu (TW); Yao-Shun Chen, Xinpu Township (TW); Po-Kai Chiu, Taoyuan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 21 days.

(21) Appl. No.: 16/884,403

(22) Filed: May 27, 2020

(65) Prior Publication Data
US 2021/0210407 A1 Jul. 8, 2021

(30) Foreign Application Priority Data

Jan. 2, 2020 (TW) ................................. 109100025

(51) Int. Cl.
*H01L 23/373* (2006.01)
*H01L 23/31* (2006.01)
(Continued)

(52) U.S. Cl.
CPC ...... *H01L 23/3735* (2013.01); *H01L 23/3107* (2013.01); *H01L 23/3736* (2013.01);
(Continued)

(58) Field of Classification Search
CPC . H01L 23/3735; H01L 24/32; H01L 23/4334; H01L 23/3107; H01L 23/3736;
(Continued)

(56) References Cited

U.S. PATENT DOCUMENTS

| 7,145,254 B2 | 12/2006 | Hirano et al. |
| 9,041,183 B2 | 5/2015 | Liang et al. |

(Continued)

FOREIGN PATENT DOCUMENTS

| CN | 103383983 A | 11/2013 |
| CN | 208819865 U | 5/2019 |

(Continued)

OTHER PUBLICATIONS

Grassmann et al., "Double Sided Cooled Module concept for High Power Density in HEV Applications", PCIM Europe 2015, May 19-21, 2015, Nuremberg, Germany, p. 442-448.

(Continued)

*Primary Examiner* — Patricia D Valenzuela
(74) *Attorney, Agent, or Firm* — Birch, Stewart, Kolasch & Birch, LLP

(57) ABSTRACT

A power module including a circuit board, a chip, a first heat-conduction and insulation substrate and a second heat-conduction and insulation substrate is provided. The circuit board includes a board and a metal block embedded in the board and exposed from a first surface and a second surface of the board opposite to one another. The chip is disposed on a side of the second surface of the board corresponding to the metal block, and the chip is electrically and thermally connected to the metal block. The first heat-conduction and insulation substrate is located on a side of the first surface of the board to be disposed on the circuit board. The second heat-conduction and insulation substrate is electrically and thermally connected to the chip.

18 Claims, 4 Drawing Sheets

(51) Int. Cl.
*H01L 23/00* (2006.01)
*H05K 7/20* (2006.01)
*H01L 23/433* (2006.01)

(52) U.S. Cl.
CPC .......... *H01L 23/4334* (2013.01); *H01L 24/32* (2013.01); *H05K 7/209* (2013.01); *H01L 24/19* (2013.01); *H01L 24/82* (2013.01); *H01L 2224/29099* (2013.01)

(58) Field of Classification Search
CPC ........... H01L 2224/29099; H01L 24/19; H01L 24/82; H05K 7/209; H05K 2201/03–0397
See application file for complete search history.

(56) References Cited

U.S. PATENT DOCUMENTS

| | | | |
|---|---|---|---|
| 9,173,329 | B2 | 10/2015 | Joo et al. |
| 9,275,926 | B2 | 3/2016 | Hable et al. |
| 9,418,930 | B2 | 8/2016 | Stahr et al. |
| 2011/0096495 | A1* | 4/2011 | Heise .................... H05K 1/0263 361/688 |
| 2013/0175704 | A1* | 7/2013 | Jeun .................... H01L 23/3735 257/777 |
| 2016/0133558 | A1* | 5/2016 | Stahr ..................... H01L 23/367 257/692 |
| 2017/0250127 | A1* | 8/2017 | Fernando .......... H01L 23/49513 |

FOREIGN PATENT DOCUMENTS

| | | |
|---|---|---|
| TW | 201330763 A1 | 7/2013 |
| TW | 201531217 A | 8/2015 |
| TW | M565469 U | 8/2018 |
| TW | I658547 B | 5/2019 |
| TW | 201935632 A | 9/2019 |

OTHER PUBLICATIONS

Taiwanese Office Action and Search Report, dated Apr. 8, 2021, for Taiwanese Application No. 109100025.

* cited by examiner

POWER MODULE

This application claims the benefit of Taiwan application Serial No. 109100025, filed Jan. 2, 2020, the disclosure of which is incorporated by reference herein in its entirety.

TECHNICAL FIELD

The disclosure relates to a power module with dual-sided heat dissipation.

BACKGROUND

In the past, the power semiconductor module was mainly the single-sided cooling type power module. Heat of power semiconductors is dissipated from the path of die attach, substrate, baseplate and heat sink. However, with the development of power electronics technology, the power dissipation of the semiconductors and electronic component has also increased, making the overheat problem increasingly serious. The single-sided cooling type power module is no longer sufficient.

For example, when applied to the design of electric vehicles, the power density of power electronics system is a critical issue. Power module has been gradually integrated into the driver system in recent years to improve the power density of the system. This type of design has advantages especially in limited vehicle body space. However, if the heat generated by these components cannot be effectively eliminated, it will affect the operating efficiency of electric vehicle and even cause safety problems. Therefore, how to develop a power module that could effectively achieve the purpose of heat dissipation in a limited space and on the premise of reducing manufacturing costs has become the goal of related industry.

SUMMARY

According to one embodiment, a power module is provided. The power module includes a circuit board, a chip, a first heat-conduction and insulation substrate and a second heat-conduction and insulation substrate. The circuit board includes a board and a metal block embedded in the board and exposed from a first surface and a second surface of the board opposite to one another. The chip is disposed on a side of the second surface of the board corresponding to the metal block, and the chip is electrically and thermally connected to the metal block. The first heat-conduction and insulation substrate is located on a side of the first surface of the board to be disposed on the circuit board. The second heat-conduction and insulation substrate is electrically and thermally connected to the chip.

The above and other aspects of the disclosure will become better understood with regard to the following detailed description of the preferred but non-limiting embodiment(s). The following description is made with reference to the accompanying drawings.

Figure 1:
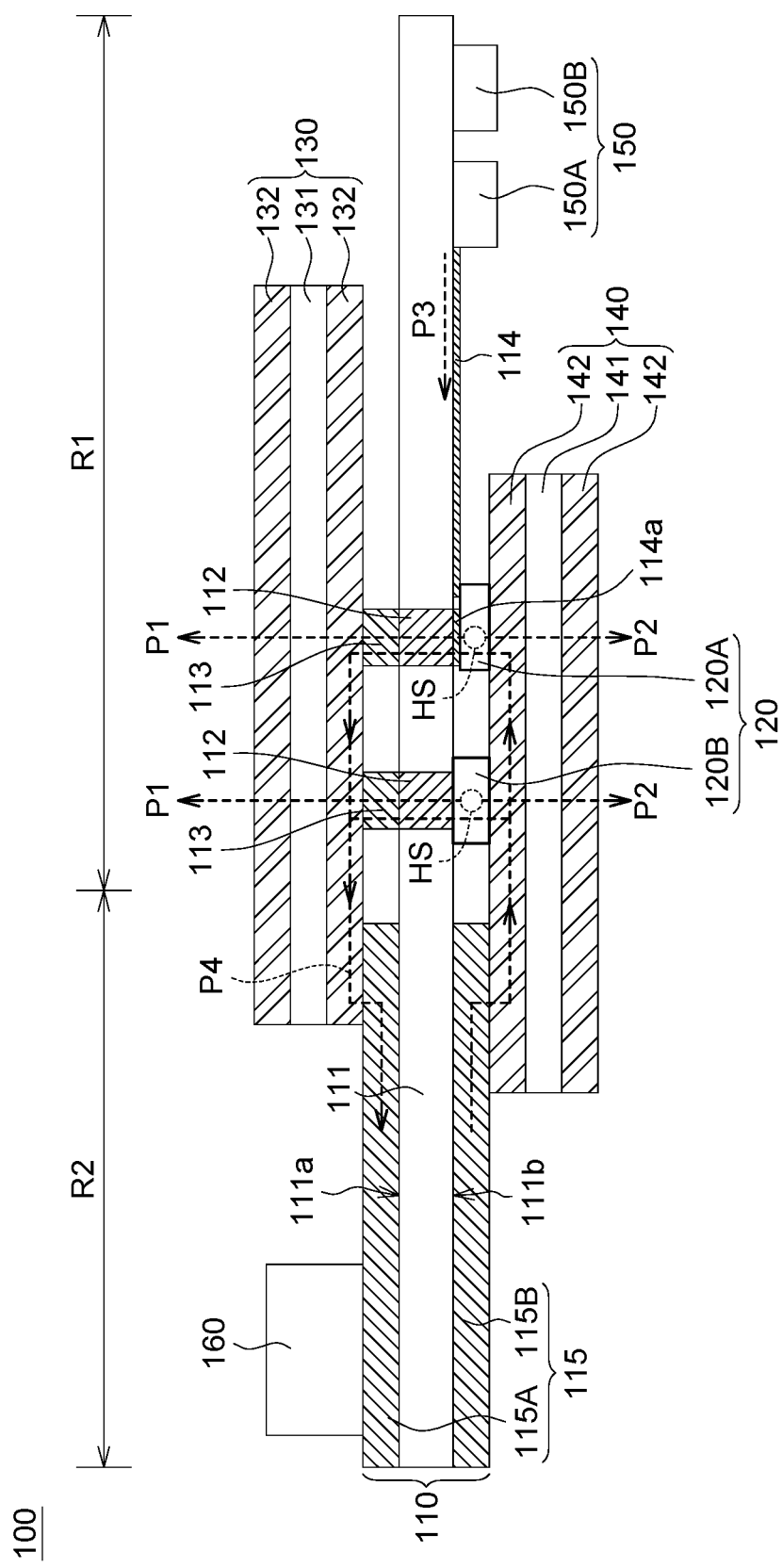
FIG. 1 is a cross-sectional view of a power module according to one embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

In the following description, a plurality of embodiments of the present disclosure will be illustrated by drawings. For the sake of clear description, many practical details will be described in the following description. It should be understood, however, that these practical details should not be used to limit the disclosure. That is, in some embodiments of the present disclosure, these practical details are unnecessary. In addition, in order to simplify the drawings, some conventional structures and components will be shown in the drawings in a simple and schematic manner. And, the same reference signs in different drawings may be regarded as corresponding components, unless they are otherwise indicated. In the drawings, the dimensions of a layer, a film, a board, a region, or a substrate are enlarged for clarity. These drawings are illustrated to clearly express the connection relationship between the elements of these embodiments, but not to show the actual size of each element or its proportional relationship.

It will be understood that when an element such as a layer, a film, a board, a region, or a substrate is referred to as being "on" or "connected to" another element, it could be directly on or connected to the element, or there may be an intermediate element therebetween. In contrast, when an element is referred to as being "directly on" or "directly connected to" another element, there is no intervening element present therebetween. In addition, "connected" may refer to a physical and/or electrical connection. Furthermore, "electrically connected" or "coupled" may indicate that there is other element between the two elements.

Exemplary embodiments will be described below with reference to cross-sectional views that are schematic views of idealized embodiments. Changes of the drawings in results such as manufacturing techniques and/or tolerances may be foreseen. The embodiments described herein should not be limited to the specific shape of the area as shown, but include deviations caused, for example, by manufacturing. For example, the flat areas shown in the drawings may often have rough and/or non-linear features. Therefore, the areas shown in the figures are schematic in nature and their shapes are not intended to illustrate their precise shapes or to limit the present disclosure.

Figure 2A:
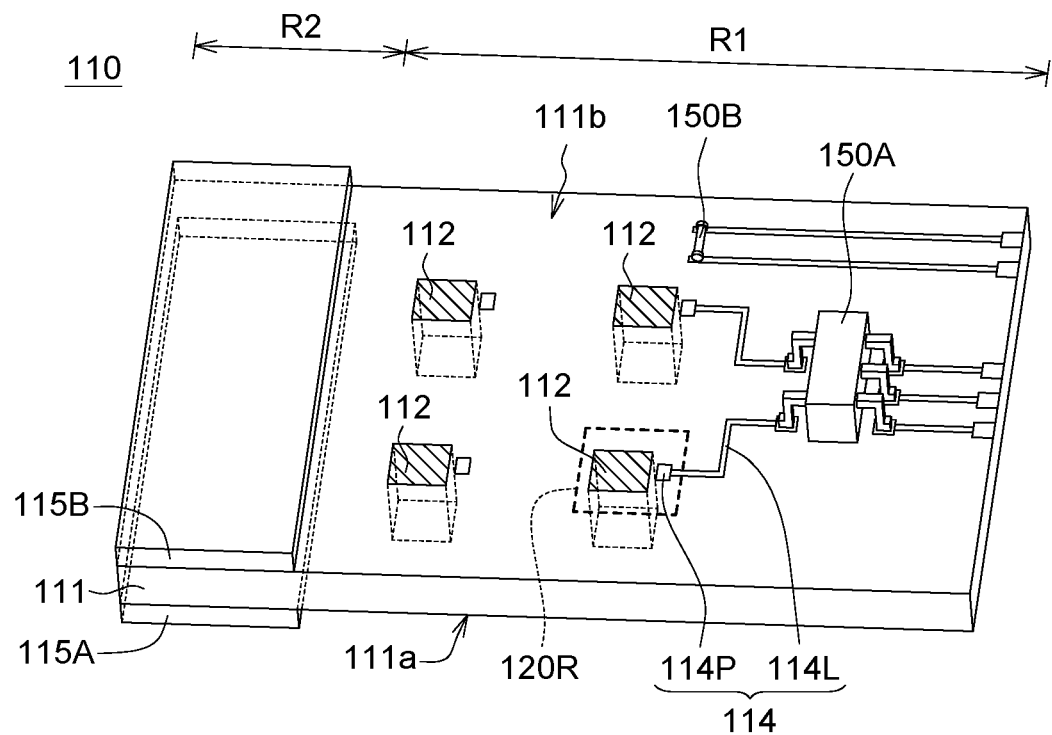
FIG. 2A is a three-dimensional view of a circuit board in a bottom view according to one embodiment of the present disclosure.
Figure 2B:
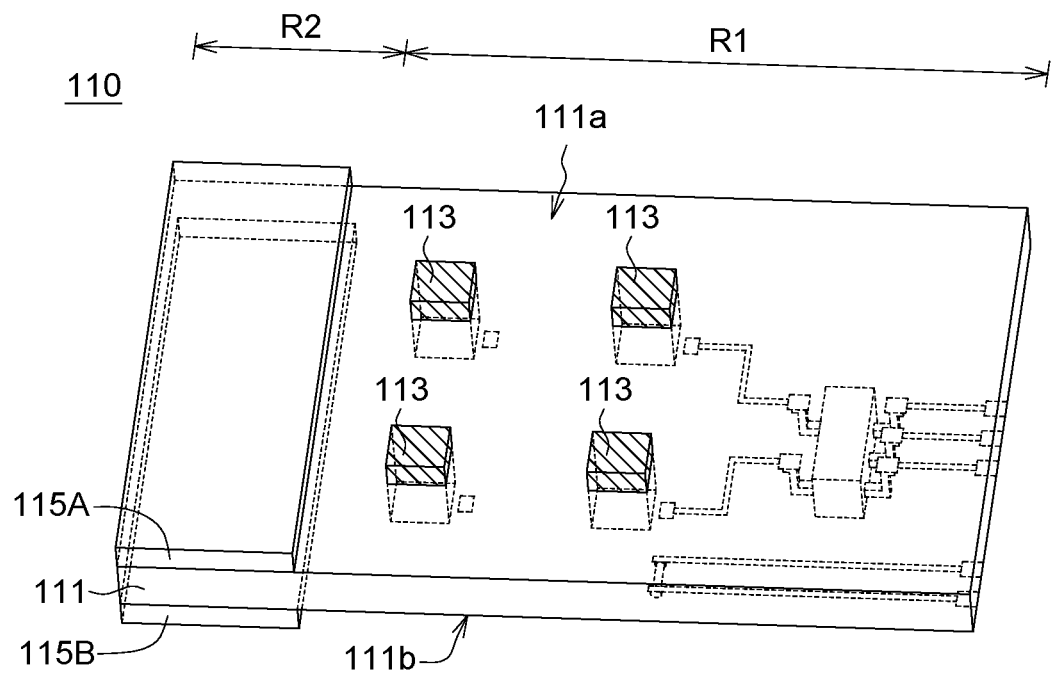
FIG. 2B is a three-dimensional view of the circuit board in a top view according to one embodiment of the present disclosure.
Figure 2C:
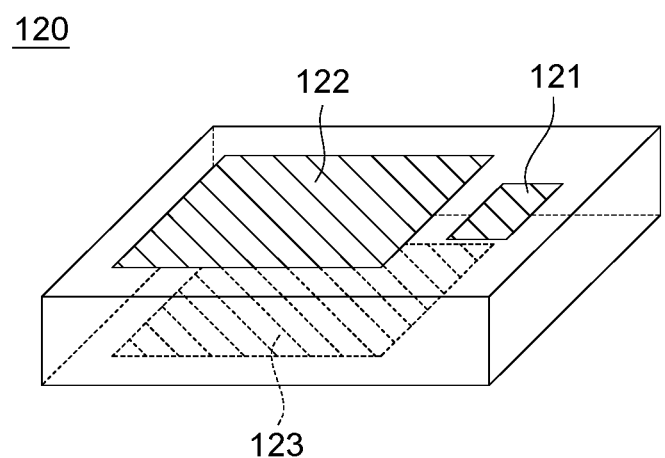
FIG. 2C is a three-dimensional view of a chip according to one embodiment of the present disclosure.

FIG. 1 is a cross-sectional view of a power module 100 according to one embodiment of the present disclosure. FIG. 2A is a three-dimensional view of a circuit board 110 in a bottom view according to one embodiment of the present disclosure. FIG. 2B is a three-dimensional view of the circuit board 110 in a top view according to one embodiment of the present disclosure. FIG. 2C is a three-dimensional view of a chip 120 according to one embodiment of the present disclosure.

Referring to FIG. 1, the power module 100 includes a circuit board 110, a chip 120, a first heat-conduction and insulation substrate 130 and a second heat-conduction and insulation substrate 140. The power module 100 may be integrated into a power conversion system such as an inverter, for example, the inverter of an electric vehicle or a hybrid electric vehicle (EV/HEV), but the present disclosure is not limited thereto.

The circuit board 110 may, for example, be a direct bonded copper (DBC) substrate or a direct plated copper (DPC) substrate. Referring to FIGS. 1, 2A and 2B, the circuit board 110 includes a board 111 and circuit layers distributed over the first surface 111a and the second surface 111b of the board 111 opposite to one another (including a gate driver circuit layer 114 and a power circuit layer 115 as illustrated), wherein the material of the board 111 is, for example, ceramic, and the gate driver circuit layer 114 and the power circuit layer 115 are, for example, copper layers. In other embodiments, the circuit board 110 may be other types of circuit boards, and the board 111 and the gate driver circuit layer 114 and the power circuit layer 115 may be other suitable materials. For example, the material of the board 111 may be glass fiber (for example, FR4 epoxy glass fiber laminate) or ceramic (such as alumina, aluminum nitride).

Furthermore, the circuit board 110 further includes a metal block 112 embedded in the board 111 and exposed from the first surface 111a and the second surface 111b of the board 111. For example, the board 111 has a through hole penetrating from the first surface 111a to the second surface 111b, and the metal block 112 is buried in this through hole. In one embodiment, the metal block 112 may be buried in this through hole by electroplating. In another embodiment, the metal block 112 may be directly inserted into this through hole. But the present disclosure is not limited to these manners.

The chip 120 is disposed on a side of the second surface 111b of the board 111 corresponding to the metal block 112, and connected to the metal block 112, wherein the connection includes electrical connection and thermal connection. The chip 120 (including the chips 120A, 120B as illustrated) may be a power chip, such as an insulated gate bipolar transistor (IGBT), a metal-oxide-semiconductor field effect transistor (MOSFET) and a diode.

The first heat-conduction and insulation substrate 130 and the second heat-conduction and insulation substrate 140 are located on a side of the first surface 111a of the board 111 and on a side of the second surface 111b of the board 111, respectively, to be disposed on the circuit board 110. The second heat-conduction and insulation substrate 140 is further electrically and thermally connected to the chip 120. The first heat-conduction and insulation substrate 130 and the second heat-conduction and insulation substrate 140 are respectively thermally connected to the chip, such that the heat generated from the heat source HS of the chip 120 is effectively transferred by means of dual-sided heat dissipation.

The first heat-conduction and insulation substrate 130 is, for example, a direct bonded copper substrate or a direct plated copper substrate. In detail, the first heat-conduction and insulation substrate 130 may include a first insulator layer 131 and two first conductive layers 132. The two first conductive layers 132 are disposed on two opposite sides of the first insulator layer 131, respectively, and one first conductive layer 132 is connected to the metal block 112 (including thermal connection and electrical connection), and the other first conductive layer 132 may be thermally connected to an additional heat dissipation device so as to further improve the heat dissipation efficiency, but the present disclosure is not limited thereto. In other embodiments, the first heat-conduction and insulation substrate 130 is, for example, an insulated metal substrate (IMS), and thus the other first conductive layer 132 may be omitted from being disposed on the other side.

Referring to FIG. 1, the power module 100 may further include a metal layer 113 formed on the first surface 111a of the board 111 at a position corresponding to the metal block 112. Thus, the chip 120 may be thermally connected to the first heat-conduction and insulation substrate 130 via the metal block 112 and the metal layer 113. Generally, the thickness of the metal block 112 is larger than that of the metal layer 113. For example, the thickness of the metal block 112 may be greater than 500 μm, and the thickness of the metal layer 113 may be less than 500 μm. Here, the metal layer 113 may be optionally disposed according to design requirements. In other embodiments, the metal layer 113 may be omitted, and the chip 120 may be thermally connected to the first heat-conduction and insulation substrate 130 via the metal block 112 directly.

On the other hand, the second heat-conduction and insulation substrate 140 is, for example, a direct bonded copper substrate or a direct plated copper substrate. In detail, the second heat-conduction and insulation substrate 140 may include a second insulator layer 141 and two second conductive layers 142. The two second conductive layers 142 are disposed on two opposite sides of the second insulator layer 141, respectively, and one second conductive layer 142 is connected to the chip 120 (including thermal connection and electrical connection), and the other second conductive layer 142 may be thermally connected to an additional heat dissipation device so as to further improve the heat dissipation efficiency, but the present disclosure is not limited thereto. In other embodiments, the second heat-conduction and insulation substrate 140 is, for example, an insulated metal substrate, and thus the other second conductive layer 142 may be omitted from being disposed on the other side.

Through the above configuration, the first heat-conduction and insulation substrate 130 and the second heat-conduction and insulation substrate 140 may be directly or indirectly thermally connected to the chip 120, respectively, and the heat generated from the heat source HS may be transferred out from the side of the first heat-conduction and insulation substrate 130 along the path P1, and may be transferred out from the second heat-conduction and insulation substrate 140 along the path P2 as well.

Referring to FIGS. 1, 2A and 2B, the circuit board 110 has a first circuit region R1 and a second circuit region R2 adjacent to one another. The chip 120 is disposed in the first circuit region R1. The gate driver circuit layer 114 is electrically connected to the chip 120 and located in the first circuit region R1. Specifically, the gate driver circuit layer 114 is disposed on the second surface 111b of the board 111. The power circuit layer 115 is electrically connected to the chip 120 and located in the second circuit region R2. Specifically, the power circuit layer 115 may include a first surface terminal 115A and a second surface terminal 115B respectively disposed on the first surface 111a and the second surface 111b of the board 111 for providing the chip 120 with power. In the embodiments, the cross-sectional area of circuit in the second circuit region R2 is larger than the cross-sectional area of circuit in the first circuit region R1. Since the power circuit layer 115 needs to allow the electrical current with larger power to be input and output, the cross-sectional area of circuit of the power circuit layer 115 is larger than that of the gate driver circuit layer 114. For example, the cross-sectional area of circuit of the power circuit layer 115 is greater than 10000 µm², and the cross-sectional area of circuit of the gate driver circuit layer 114 is less than 6000 µm².

In the embodiments, the power module 100 may further include an electronic device 150 (including the driver chip 150A and other element 150б as illustrated). The electronic device 150 is located in the first circuit region R1. The driver chip 150A may provide the chip 120 with driver signals via the gate driver circuit layer 114.

As shown in FIG. 2A, the gate driver circuit layer 114 may include a plurality of layouts 114L and bonding pads 114P, and the circuit board 110 further has a placement zone for chip 120R. Referring to FIGS. 1, 2A and 2C, the chip 120 may include a first electrode 121, a second electrode 122 and a third electrode 123. When the chip 120 is disposed on a side of the second surface 111b of the board 111, the first electrode 121 is aligned with the bonding pad 114P to be electrically connected to the bonding pad 114P, and the second electrode 122 is aligned with the metal block 112 to be electrically connected to the metal block 112. Therefore, the driver chip 150A may provide the chip 120 with driver signals via the gate driver circuit layer 114 along the path P3.

Referring to FIGS. 1 and 2B, one first conductive layer 132 of the first heat-conduction and insulation substrate 130 is further electrically connected to the first surface terminal 115A. In addition, the height from the top surface of the metal layer 113 to the first surface 111a of the board 111 is consistent with the thickness of the first surface terminal 115A, so as to avoid the insufficient thickness of the metal block 112 that results in the height difference from the first surface terminal 115A. Thus, the first conductive layer 132 of the first heat-conduction and insulation substrate 130 could smoothly contact the first surface terminal 115A and the metal layer 113 simultaneously, thereby ensuring an electrical connection structure between the three.

Here, the metal layer 113 and the first surface terminal 115A may belong to the same metal layer structure. For example, the first surface terminal 115A and the metal layer 113 may be the copper layers electroplated on the first surface 111a of the board 111 at the same time, but the present disclosure is not limited thereto. In another embodiment, the metal layer 113 may be integrated with the metal block 112.

One second conductive layer 142 of the second heat-conduction and insulation substrate 140 is further electrically connected to the second surface terminal 115B. In addition, in some embodiments, the circuit board 110 may further include a local metal layer 114a correspondingly disposed between the metal block 112 and the chip 120 (the local metal layer 114a as illustrated is between the metal block 112 and the chip 120A), such that the height from a surface of the third electrode 123 of the chip 120 (as shown in FIG. 2C) to the second surface 111b of the board 111 is consistent with the thickness of the second surface terminal 115B, so as to avoid the insufficient thickness of the metal block 112 that results in the height difference from the second surface terminal 115B. Thus, the second conductive layer 142 of the second heat-conduction and insulation substrate 140 could smoothly contact the second surface terminal 115B and the chip 120 simultaneously, thereby ensuring an electrical connection structure between the three.

Here, the local metal layer 114a and the gate driver circuit layer 114 may belong to the same metal layer structure. For example, the gate driver circuit layer 114 and the local metal layer 114a may be the copper layers electroplated on the second surface 111b of the board 111 at the same time, but the present disclosure is not limited thereto.

Through the above configuration, a continuous conductive path P4 may be established in the power module 100, and power may be provided to the chip 120 through the path P4 to access the operation of the chip 120. In addition, since the loop inductances of the power input and output may be offset against each other, the parasitic inductance may be further reduced.

In the present embodiment, since the gate driver circuit layer 114 used for driving the chip 120 by the driver chip 150A are directly formed on the circuit board 110, the chip 120 does not need to be electrically connected to the driver circuit by wire bonding as in the conventional design, and the signal transmission distance may also be reduced, lowering the parasitic inductance. Furthermore, through the design of the metal block 112 embedded in the circuit board 110, the alignment of the metal block 112 is easy, which greatly reduces the difficulty of the assembly process. In addition, the embedded metal block 112 may serve as an electrical and thermal conduction path, which may avoid short-circuit situations and also improve the heat dissipation effect on the premise of reducing the volume of the power module 100.

Besides, in the embodiments, the circuit having larger cross-sectional area is disposed in the second circuit region R2. Since the circuit in the second circuit region R2 is loaded with a larger current, the power of this region is higher. The high power inputs to the chip 120 and generates larger heat. However, since most of the heat may be transferred out via the first heat-conduction and insulation substrate 130 and the second heat-conduction and insulation substrate 140, the temperature of the first circuit region R1 could be controlled effectively, preventing the heat from affecting the operation of the driver chip 150A.

Furthermore, in the embodiments, some electronic elements may further be integrated into the power module 100. Or in another embodiment, some passive elements 160 such as capacitors and inductors may also be integrated into the power module 100. Referring to FIGS. 1 and 2A, other element 150B may be disposed on a side of the second surface 111b of the board 111 to be disposed on the circuit board 110. Other element 150B is, for example, a control chip, sensor or passive component, but the present disclosure is not limited thereto. For example, when the control chip detects that the temperature is abnormal through the temperature sensor, the control chip may control the driver chip 150A in time to provide a protection mechanism.

Figure 3:
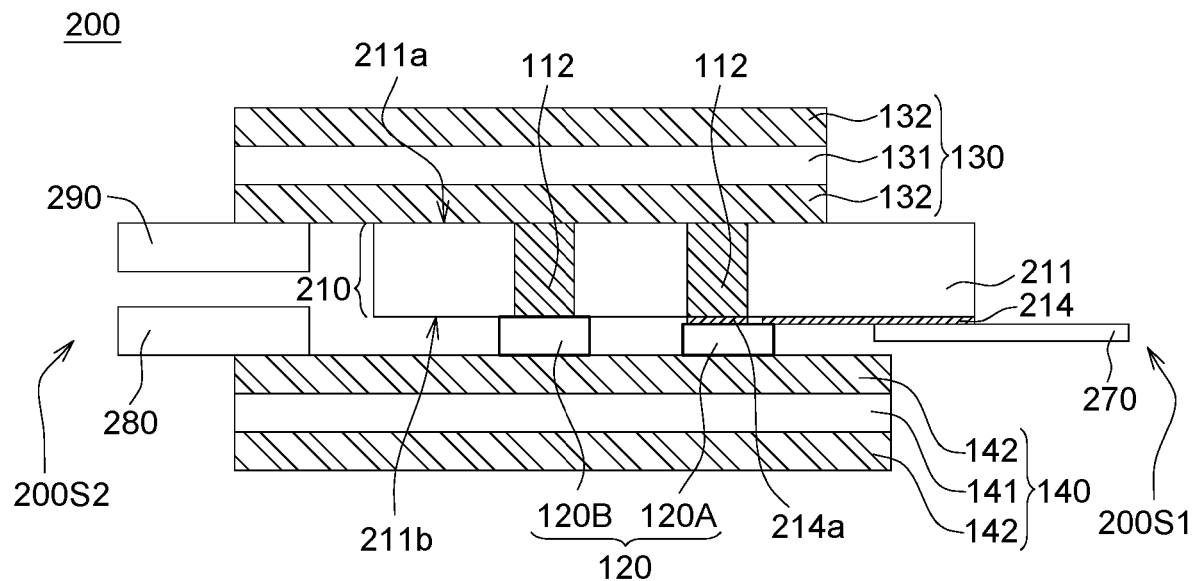
FIG. 3 is a cross-sectional view of a power module according to another embodiment of the present disclosure.

Referring to FIG. 3, a cross-sectional view of a power module 200 according to another embodiment of the present disclosure is shown. The power module 200 includes a circuit board 210, a first heat-conduction and insulation substrate 130, a second heat-conduction and insulation substrate 140, a first lead frame 270, a second lead frame 280 and a third lead frame 290. The circuit board 210 includes a board 211 and a gate driver circuit layer 214. The board 211 and the gate driver circuit layer 214 are similar to the board 111 and the gate driver circuit layer 114 of the power module 100 as shown in FIG. 1. The first heat-conduction and insulation substrate 130 and the second heat-conduction and insulation substrate 140 are disposed on a side of the first surface 211a of the board 211 and on a side of the second surface 211b of the board 211, respectively.

Furthermore, when the number of the chip 120 is plural, the circuit board 210 may further include a local metal layer 214a correspondingly disposed between the metal block 112 and the chip 120A with a thinner thickness, so as to compensate for the height difference resulted from the difference in thickness between the chip 120A and the chip 120B.

The difference from the power module 100 as shown in FIG. 1 is mainly the design of the circuit board 210, the first lead frame 270, the second lead frame 280 and the third lead frame 290, and the rest parts that are the same or similar are indicated with the same reference sighs and contents and not repeated again.

The power module 200 has a first side 200S1 and a second side 200S2 opposite to one another. The first lead frame 270 is disposed on the first side 200S1 of the power module 200, and electrically connected to the chip 120 for transmitting the driver signals to the chip 120. Further, the first lead frame 270 may be electrically connected to the chip via the gate driver circuit layer 214 disposed on the second surface 211b of the board 211.

The second lead frame 280 and the third lead frame 290 are disposed on the second side 200S2 of the power module 200, and electrically connected to the chip 120 for providing the chip 120 with power. Further, the second lead frame 280 may be electrically connected to the chip 120 via the second conductive layer 142 of the second heat-conduction and insulation substrate 140. The third lead frame 290 may be electrically connected to the chip 120 via the first conductive layer 132 of the first heat-conduction and insulation substrate 130 and the metal block 112 embedded in the board 211.

Figure 4:
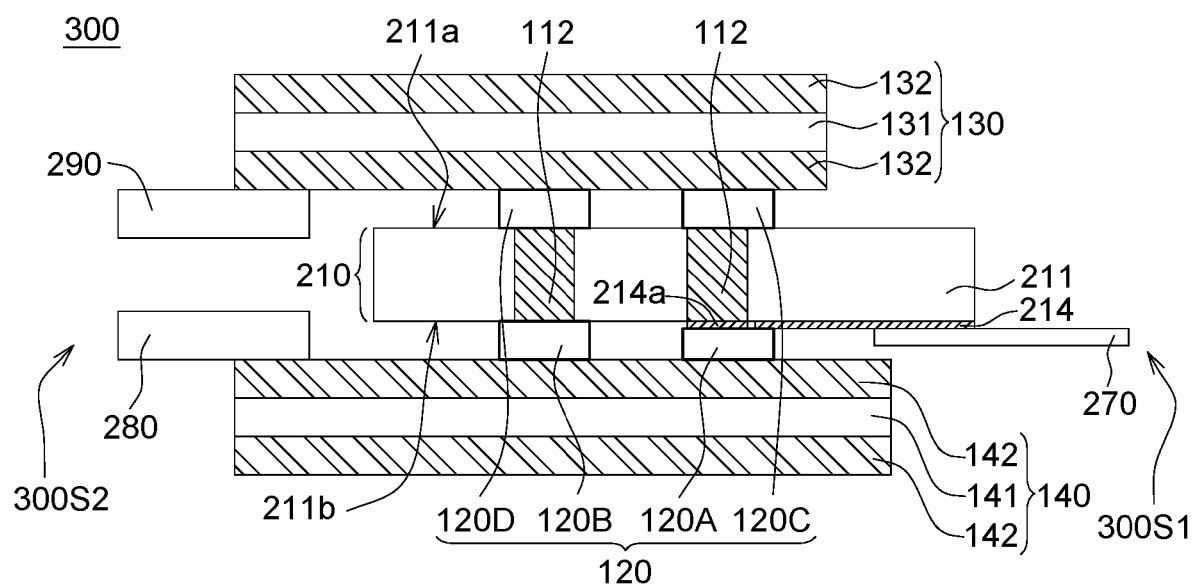
FIG. 4 is a cross-sectional view of a power module according to still another embodiment of the present disclosure.

Referring to FIG. 4, a cross-sectional view of a power module 300 according to still another embodiment of the present disclosure is shown. The power module 300 in the present embodiment is similar to the power module 200 as shown in FIG. 3; that is, the first lead frame 270 is disposed on the first side 300S1 of the power module 300, and the second lead frame 280 and the third lead frame 290 are disposed on the second side 300S2 of the power module 300. The difference is that the power module 300 further includes other chips 120C, 120D electrically and thermally connected between the metal block 112 and the first conductive layer 132 of the first heat-conduction and insulation substrate 130.

Through the above configuration, the embedded metal block 112 may serve as an electrical and thermal conduction path, which may reduce the volume of the power modules 200, 300 and also improve the heat dissipation effect.

In summary, in the power modules of the embodiments of the present disclosure, a metal block is buried directly in the circuit board, so that the metal block serves as an electrical and thermal conduction path. This design may avoid short-circuit situations and improve the heat dissipation effect on the premise of reducing the volume of the power module. Furthermore, a continuous conductive path may be established in the power module to provide the chip with power, and the loop inductances of the power input and output may be offset against each other to reduce parasitic inductance.

In addition, in some embodiments, since the driver chip used for driving the chip and the gate driver circuit layer connecting the driver chip to the chip may be directly formed on the circuit board, the chip does not need to be electrically connected to the driver circuit by wire bonding as in the conventional design, and the signal transmission distance may also be reduced, lowering the parasitic inductance. Moreover, the design of the metal block embedded in the circuit board facilitates the alignment of the metal block, which greatly reduces the difficulty of the process.

Besides, in some embodiments, the circuit board are divided into a first circuit region and a second circuit region. The circuit having larger cross-sectional area (for example, the power circuit layer for transmitting power) is disposed in the second circuit region. Since the circuit in the second circuit region is loaded with a larger power, the temperature of this region is higher. However, since most of the heat may be transferred out via the first heat-conduction and insulation substrate and the second heat-conduction and insulation substrate, the temperature of the first circuit region could be controlled effectively, preventing the heat from affecting the electronic element (such as the chip and the driver chip) or the circuit (for example, the gate driver circuit layer) located in the first circuit region.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A power module comprising:
   a circuit board comprising a board and a metal block embedded in the board and exposed from a first surface and a second surface of the board opposite to one another;
   a chip disposed on a side of the second surface of the board corresponding to the metal block, and the chip electrically and thermally connected to the metal block;
   a first heat-conduction and insulation substrate located on a side of the first surface of the board to be disposed on the circuit board; and
   a second heat-conduction and insulation substrate electrically and thermally connected to the chip.

2. The power module according to claim 1, wherein the circuit board has a first circuit region and a second circuit region adjacent to one another, the chip is disposed in the first circuit region, and a cross-sectional area of circuit in the second circuit region is larger than a cross-sectional area of circuit in the first circuit region.

3. The power module according to claim 2, wherein the circuit board further comprises a gate driver circuit layer disposed on the second surface of the board and electrically connected to the chip, and the gate driver circuit layer is located in the first circuit region.

4. The power module according to claim 2, wherein the circuit board further comprises a power circuit layer electrically connected to the chip for providing the chip with power, and the power circuit layer is located in the second circuit region.

5. The power module according to claim 4, wherein the power circuit layer comprises a first surface terminal and a second surface terminal respectively disposed on the first surface and the second surface of the board.

6. The power module according to claim 5, wherein the first heat-conduction and insulation substrate comprises a first conductive layer electrically connected to the first surface terminal and the metal block.

7. The power module according to claim 6, wherein the circuit board further comprises a metal layer correspondingly disposed between the metal block and the first conductive layer, and a height of the metal layer from the first surface of the board is consistent with a thickness of the first surface terminal.

8. The power module according to claim 7, wherein the metal block and the metal layer are integrally formed.

9. The power module according to claim 5, wherein the second heat-conduction and insulation substrate comprises a second conductive layer electrically connected to the second surface terminal and the chip.

10. The power module according to claim 9, wherein the circuit board further comprises a local metal layer correspondingly disposed between the metal block and the chip so as to adjust a height of the chip from the second surface of the board consistent with a thickness of the second surface terminal.

11. The power module according to claim 1, wherein the chip is a power chip.

12. The power module according to claim 1, further comprising a temperature sensor located on the side of the second surface of the board to be disposed on the circuit board.

13. The power module according to claim 1, wherein the power module has a first side and a second side opposite to one another, and further comprises:
 a first lead frame disposed on the first side of the power module and electrically connected to the chip;
 a second lead frame disposed on the second side of the power module and electrically connected to the chip; and
 a third lead frame disposed on the second side of the power module and electrically connected to the chip.

14. The power module according to claim 13, wherein the second heat-conduction and insulation substrate comprises a second conductive layer, and the second lead frame is electrically connected to the chip via the second conductive layer.

15. The power module according to claim 13, wherein the first heat-conduction and insulation substrate comprises a first conductive layer, and the third lead frame is electrically connected to the chip via the first conductive layer.

16. The power module according to claim 13, wherein the circuit board further comprises a gate driver circuit layer disposed on the second surface of the board and electrically connected to the chip, and the first lead frame is electrically connected to the chip via the gate driver circuit layer.

17. The power module according to claim 15, further comprising another chip electrically and thermally connected between the metal block and the first conductive layer.

18. The power module according to claim 13, wherein the number of the chip is plural, the circuit board further comprises a local metal layer correspondingly disposed between the metal block and the chips so as to adjust heights of the chips from the second surface of the board consistent with one another.

* * * * *